US006977382B2

(12) United States Patent
Löwer

(10) Patent No.: US 6,977,382 B2
(45) Date of Patent: Dec. 20, 2005

(54) METHOD FOR MEASURING THE INTENSITY PROFILE OF AN ELECTRON BEAM, IN PARTICULAR A BEAM OF AN ELECTRON-BEAM MACHINING DEVICE, AND/OR FOR MEASURING AN OPTICAL SYSTEM FOR AN ELECTRON BEAM AND/OR FOR ADJUSTING AN OPTICAL SYSTEM FOR AN ELECTRON BEAM, MEASURING STRUCTURE FOR SUCH A METHOD AND ELECTRON-BEAM MACHINING DEVICE

(75) Inventor: Thorsten Löwer, Brachttal (DE)

(73) Assignee: Pro-Beam AG & Co. KGAA, (DE)

( * ) Notice: Subject to any disclaimer, the term of this patent is extended or adjusted under 35 U.S.C. 154(b) by 0 days.

(21) Appl. No.: 10/619,933

(22) Filed: Jul. 15, 2003

(65) Prior Publication Data

US 2005/0173650 A1    Aug. 11, 2005

(30) Foreign Application Priority Data

Jul. 17, 2002   (DE)   .............................. 102 32 230

(51) Int. Cl.⁷ .......................................... G01N 27/00
(52) U.S. Cl. ..................... 250/397; 250/398; 250/307
(58) Field of Search ............................. 250/397, 398, 250/307; 216/39

(56) References Cited

U.S. PATENT DOCUMENTS

| 3,409,799 | A |   | 11/1968 | Kurzwell et al. |
| 3,752,952 | A |   | 8/1973  | Ruge et al. |
| 4,794,259 | A | * | 12/1988 | Sanderson et al. .......... 250/397 |
| 5,169,488 | A | * | 12/1992 | Giuffre et al. ................ 216/39 |
| 6,166,380 | A | * | 12/2000 | Kitagawa et al. ........... 250/307 |
| 2001/0052573 | A1 | * | 12/2001 | Takakuwa .................... 250/398 |

FOREIGN PATENT DOCUMENTS

| DE | 37 18 177 A1 | 12/1988 | |
| DE | 101 29 019 A1 | 1/2002 | |
| EP | 0 242 993 | 10/1987 | |
| GB | 2132390 | * 12/1983 | ............ G05D 3/00 |
| GB | 2 132 390 A | 7/1984 | |

* cited by examiner

*Primary Examiner*—Nikita Wells
*Assistant Examiner*—James J. Leybourne
(74) *Attorney, Agent, or Firm*—Factor & Lake

(57) ABSTRACT

To measure the intensity profile of an electron beam the electron beam is conducted on to a measuring structure having areas with different back-scattering properties, and back-scattered electrons which are produced by scanning of the measuring structure by the electron beam by means of a deflector unit are measured by a sensor ring. The measuring structure can preferably be installed into and removed from an electron-beam welder and consists of a graphite slab from which a tungsten needle projects perpendicularly.

62 Claims, 5 Drawing Sheets

METHOD FOR MEASURING THE INTENSITY PROFILE OF AN ELECTRON BEAM, IN PARTICULAR A BEAM OF AN ELECTRON-BEAM MACHINING DEVICE, AND/OR FOR MEASURING AN OPTICAL SYSTEM FOR AN ELECTRON BEAM AND/OR FOR ADJUSTING AN OPTICAL SYSTEM FOR AN ELECTRON BEAM, MEASURING STRUCTURE FOR SUCH A METHOD AND ELECTRON-BEAM MACHINING DEVICE

Method for measuring the intensity profile of an electron beam, in particular a beam of an electron-beam machining device, and/or for measuring an optical system for an electron beam and/or for adjusting an optical system for an electron beam, measuring structure for such a method and electron-beam machining device.

The invention relates to a method for measuring the intensity profile of an electron beam, in particular a beam of an electron-beam machining device, and/or for measuring an optical system for an electron beam and/or for adjusting an optical system for an electron beam, to a measuring structure for such a method and to an electron-beam machining device.

In the present description and the claims an optical system for an electron beam should be understood to be any arrangement which can influence the geometry of the cross-section of an electron beam and/or the alignment of the axis of an electron beam. In practice, these arrangements comprise electrical and/or magneto-optical components, in particular electrical and/or magnetic lenses, stigmators and deflectors.

An optical system can be formed by a single component of this kind or can include a plurality of such components.

In electron-beam welding, for example, in order to produce weld seams of consistent and known quality it is advantageous if the intensity profile of the electron beam used in the electron-beam welder is known and can be measured as closely as possible before the process.

Knowledge of the imaging properties of an optical system for the beam of the electron-beam machining device, and the possibility of automatically adjusting the beam cross-section and the imaging properties to reference values, would also be advantageous when processing workpieces by means of electron-beam welding.

Conventionally, the intensity profile of an electron beam is measured in such a way that known parts of the electron beam are directed successively into a collecting device, in particular a Faraday cage. As is described in the book by Schultz, "Elektronenstrahlschweissen", Fachbuchreihe Schweisstechnik, DVS-Verlag, pp. 15–20, different kinds of measuring bodies can be used to conduct a portion of the beam into the collecting device, the electron beam being deflected relatively to the measuring body by means of a magnetic field so that different parts of the cross-section of the electron beam reach the collecting device successively.

The simplest measuring body of this kind includes a threshold edge. Two opposed measuring bodies of this kind form a measuring structure having a slit aperture downstream of which the part of the beam which has passed through is measured by a sensor located there. Using such a measuring structure the beam profile can be measured in one direction. By means of a pinhole aperture the intensity profile of an electron beam can also be measured in a second direction in relation to the first, the electron beam being guided part by part across the pinhole by means of the above-mentioned magnetic field, the control technology being known from scanning electron microscopy.

A disadvantage in the state of the art is that a collecting device arranged on the axis of the electron gun (hereinafter abbreviated to "principal beam axis") takes up space in the area where the workpiece is arranged in an electron-beam machining device. A collecting device (sensor) arranged in a second beam path deviating from the actual electron beam path requires additional space. Furthermore, precisely the same conditions for measuring the intensity profiles are not present in this case as in subsequent welding.

It is the object of the invention to make possible electron beam measurement in conjunction with compact construction of the apparatus.

This object is achieved by a method having the features specified in claim 1.

According to the invention the electron beam is guided by relative movement with respect to a measuring structure on to different points of said measuring structure which have different back-scattering properties, and the stream of back-scattered electrons is measured as a function of the relative movement of the electron beam and the measuring structure.

In the context of the present Application, back-scattered electrons are understood to be each electron reflected back from a surface which has a component in a direction opposed to the actual electron propagation, i.e. back-scattered electrons in the narrower sense and secondary electrons.

Because it is the back-scattered electrons which are measured, a suitable sensor, for example a sensor ring, can be arranged around the electron beam close to the deflecting magnets which are present in any case, without additional space being required.

A further advantage of the method according to the invention is that only a passive measuring structure is additionally required to carry it out, so that no additional electrical lines to the measuring area need to be installed, which installation would present difficulties in electron-beam welders used for series production, in which the workpieces are moved in and out on pallets.

Advantageous refinements of the invention are specified in the subsidiary claims.

The refinement according to claim 2 has the advantage that measuring structures which are already known can be used, the transmitting part of the measuring structure, i.e. the aperture, does not back-scatter and the rest of the measuring structure back-scatters at least weakly.

In some electron-beam machining devices provision is made in any case whereby a workpiece to be processed can be observed by means of a scanning electron imaging function before processing. In this case it is especially advantageous to make use of the invention because the same sensors which are used as back-scattered electron measuring devices can be used for imaging.

With the refinement of the invention according to claim 3 especially good contrast is obtained between the electrons back-scattered through the measuring body, which are used for measuring the cross-sectional profile of the electron beam, and electrons back-scattered diffusely, for example, from the surface of a base of the measuring structure.

The refinement of the invention according to claim 4 is also advantageous with regard to good contrast when measuring the cross-sectional profile.

If the back-scattering surface used for measuring the beam cross-section is spaced apart from the upper face of a base of the measuring structure, as specified in claim 5, this also has a favourable effect on the precision of measurement and on contrast in cross-section measurement.

The refinement of the invention according to claim 6 is advantageous with regard to low manufacturing costs for small back-scattering surfaces and with regard to good contrast.

The refinement according to claim 7 also serves to improve the back-scattering behaviour of the back-scattering surface.

With the refinement of the invention according to claim 8 it is achieved that circumferential sections of the needle located downstream of the back-scattering surface do not give rise to additional back-scattered electrons, which would impair the contrast of the measuring process.

The refinement of the invention according to claim 9 is advantageous with regard to high resolution of the measuring method.

According to claim 10 the back-scattered electrons are measured in a very simple manner. Suitable sensor rings, which also provide a possibility of scanning electronic imaging of a workpiece surface, are often already present in such electron-beam machining devices.

In principle, the relative motion between electron beam and measuring structure can be produced both by moving the measuring structure and by moving the electron beam (and also by moving electron beam and measuring structure). However, the manner of producing the relative motion specified in claim 11 can be implemented without mechanical means and very rapidly, and makes it possible to determine the quality of beam deflection by the optical system.

If a measuring structure as specified in claim 12 is used in the method for determining the intensity profile of an electron beam, the intensity profiles for a plurality of different angles of deflection of the electron beam can be measured simultaneously. In this way it can be determined whether and to what extent the intensity profile depends on the deflection of the electron beam.

In this case, using the method according to claim 13, the intensity profile within a predefined overall deflection range for the electron beam can be measured at different points uniformly distributed over the deflection range.

In this case, with the refinement according to claim 14, it is ensured that the back-scattering surfaces are in each case aligned perpendicularly to the mean direction of the electron beam.

If circular back-scattering surfaces according to claim 15 are used, these back-scattering surfaces behave isotropically, i.e. they can be traversed in any direction without the need for direction-dependent corrections of the measurement signals.

If a measuring structure with narrow back-scattering strips according to claim 16 is used, coarse information on the intensity distribution within the electron beam over a relatively large measuring area can be obtained in a simple manner. Such measuring structures are also well suited to testing the imaging properties of the electron beam optical system and to providing the transmitter for the actual signal for a control circuit with which the cross-section of the electron beam is automatically minimised and/or reference imaging properties of the optical system are set.

In the method according to claim 17, the intensity profile of the electron beam is measured in two mutually perpendicular directions so that complete planar information on the energy density in the electron beam is obtained. If this is done for different focusing conditions (changing the current supply to the focusing lens) or for different positions of the measuring structure on the beam axis, a complete three-dimensional beam tomography is obtained.

The refinement of the invention according to claim 18 is in its turn advantageous with regard, firstly, to providing the necessary mechanical support for the back-scattering surfaces or the surfaces having greater transmission and, secondly, to preventing the mechanical support for the surface irregularities with regard to absorption/back-scatter from producing significant quantities of unwanted scattered electrons.

The method according to claim 19 makes it possible, when using a regular measuring structure which was intended as such for measuring the intensity profile of an electron beam, at the same time to measure the imaging properties of the electron beam optical system.

With the method specified in claim 20 an easily evaluated overall picture of the imaging properties of the optical system can be obtained in a simple manner.

According to claim 21 the electron beam can be automatically focused in such a way that its cross-section is minimised.

The measuring structure specified in claim 22 has an especially simple mechanical structure.

The refinement of the measuring structure according to claim 23 again serves to prevent distortions of the measurement results through geometrical effects.

A measuring structure according to claim 24 is distinguished by an especially simple mechanical structure and good contrast.

In this case, according to claim 25, back-scattering surfaces with precise spatial orientation and good back-scattering properties are obtained in a simple manner.

The refinement of the invention according to claim 26 again ensures that the back-scattering surfaces are reliably and permanently oriented in space in a simple manner, without the mechanical means used for this purpose giving rise to unwanted back-scattered electrons.

The refinement of the invention according to claim 27 provides a measuring structure which again is suited to measuring the cross-sectional profile of an electron beam for different angles of deflection and which makes possible simple evaluation of the stream of back-scattered electrons.

With a measuring structure as specified in claim 28 the imaging properties of the electron beam optical system can be tested (via the grid-lines) in a simple manner, and at the same time the intensity profiles of the electron beam can be simply determined (via the back-scattering surfaces) for different angles of deflection.

Claim 29 relates to a measuring method whereby the beam cross-section and/or the imaging properties of the optical system is/are determined from the stream of electrons passing through the measuring structure.

Claims 30 to 33 relate to electron-beam machining devices in which the intensity profile of the electron beam and the imaging properties of the optical system for the electron beam can be measured in a simple manner.

The refinement according to claims 34 and 35 are advantageous with regard to sharp and high-contrast imaging of small or extensive back-scattering surfaces of a measuring structure.

In a method according to the invention whereby the quality of the optical system of the electron-beam machining device is determined, the sensors for measuring the back-scattered electrons are used in such a way that an electronic raster recording of a measuring structure having parts with different back-scattering properties is made and is then evaluated. Conclusions regarding the quality of the magneto-optical elements of the focusing unit and of the optical system can be drawn from distortions in the image, in particular with the aid of a computer.

A somewhat different measuring structure having a regular structure, in particular a grid or network, is preferably used for this purpose, so that conventional calculating procedures known from optics can be used to calculate distortion. In a preferred embodiment the grid or network lines are made of a strongly back-scattering material, in particular a metal, whereas their substrate is formed by a material which does not back-scatter or does so only weakly, for example, graphite.

A measuring structure having regularly arranged areas of increased transmission (e.g. bore holes) or regularly arranged areas of increased back-scatter (e.g. back-scattering surfaces), or having a grid or network, are also the subject of the present invention, preferred embodiments having the above-mentioned material properties.

It is also conceivable that a needle or a plurality of needles having ground end face/s or other back-scattering elements, which is/are used in the method for measuring the intensity profile, might be used, preferably detachably, in a measuring structure having a grid network, in order to be able to measure both intensity profiles of the beam and imaging properties of the optical system.

Alternatively, an arrangement of back-scattering surfaces and a back-scattering grid arrangement may also be provided on laterally adjacent areas of the upper face of the base of a measuring structure, so that these areas can be placed optionally on the principal beam axis.

Preferred embodiments of the invention are described below with reference to the drawings, in which.

In an electron-beam welder an electron beam 10 is focused by a controllable focusing unit shown as a single lens 12. This lens may include, in particular, a stigmator (two cylindrical lenses arranged at 90°) which are separately controllable, in order to modify the shape of the beam cross-section, in particular to give it a circular form.

Figure 1:
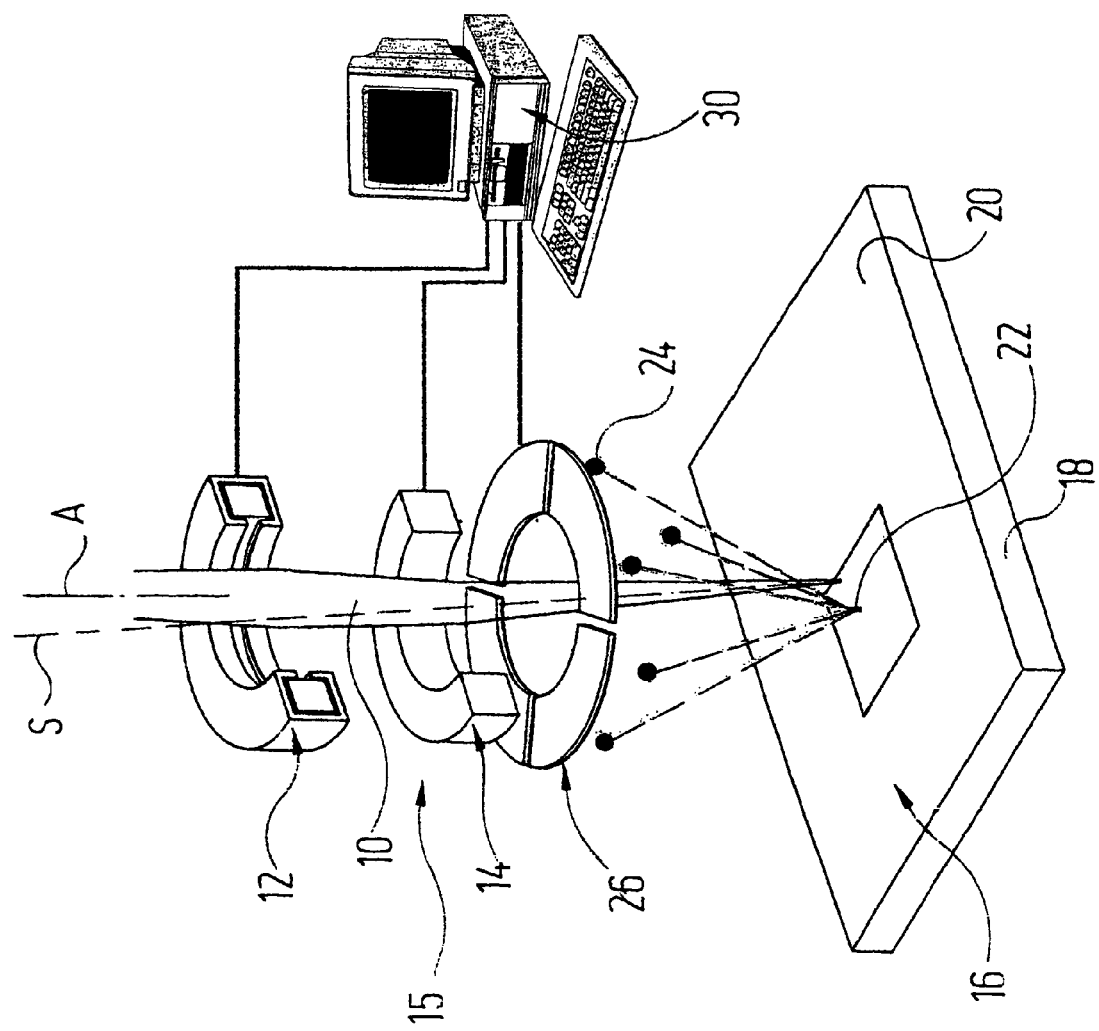
FIG. 1 shows schematically the structure for measuring the intensity profile of an electron beam of an electron-beam welder.

In FIG. 1 the principal beam direction, i.e. the direction in which the electron beam 10 is generated by the electron gun (not shown in detail) of the welder and in which it impinges on a workpiece (not shown) under working conditions, if it is not deflected, is indicated by A.

The electron beam 10 can be deflected perpendicularly to the beam direction by means of a magnetic deflector unit 14 located downstream of the lens 12. The deflector unit 14 includes at least two separately controllable coils (not shown in detail) for deflecting the electron beam 10 in two directions perpendicular to one another.

The focusing unit 12 and the optical system 14 together form an optical system 15 of the electron-beam welder.

A measuring structure designated as a whole by reference numeral 16 is provided for measuring the intensity profile of the electron beam 10. This measuring structure consists of a base formed by a graphite slab 18 having a flat surface 20, from which a tungsten needle 22 projects perpendicularly in its central area, i.e. in the area on which the electron beam 10 impinges if it is not strongly deflected by the deflector unit 14.

The tungsten needle 22 is ground smooth on its flat end face disposed perpendicularly to the principal beam direction A and facing towards the electron beam source. The surface 20 of the graphite slab 18 is also perpendicular to the principal beam direction A.

The diameter of the tungsten needle 22 is so dimensioned that it is significantly smaller than the diameter of the electron beam 10.

The selection of the materials for the measuring structure 16 and its geometry and arrangement have the following effects:

The smoothly-ground transverse end face of the tungsten needle 22 has a strong back-scattering effect, i.e. electrons from the electron beam 10 are deflected back in direction A from which the electron beam 10 issues, or in a direction having a component in the direction of the electron source. Electrons back-scattered by the needle 22, which are obtained when the electron beam 10 brushes across the tip of the needle 22, are indicated schematically by 24 in FIG. 1. The graphite slab 18, by contrast, has hardly any back-scattering effect so that the tungsten needle 22 is strongly differentiated from the surface 20.

The back-scattered electrons are measured by means of a sensor ring denoted as a whole by 26 and consisting of four sensor segments 28, the sensor ring 26 surrounding the path of the electron beam, viewed in cross-section, and being a conventional ring of the type normally used in electronic raster observation arrangements for detecting back-scattered electrons. For this reason the sensor ring 26 can be used both for measuring the stream of the back-scattered electrons and for imaging.

The primary concern of the invention is to determine the strength of the stream of back-scattered electrons, although the principal consideration is not the absolute number of back-scattered electrons, not all of which, of course, are detected by the sensor ring, but the relative intensity profile of the electron beam 10, that is, the distribution of electrons in the electron beam 10 in the direction perpendicular to the beam direction.

The beam direction S should be understood as the mean direction of the electron beam as it is generated by the optical system 14, while disregarding deflections of small amplitude which occur in order to produce scanning movements of the electron beam 10 across the end face of a tungsten needle 22.

If the electron beam 10 is directed by the deflector unit 14 to different points on the measuring structure 16, the number of back-scattered electrons 24 increases or decreases depending on the point on the measuring structure 16 on which the electron beam 10 impinges. An especially high number of back-scattered electrons is produced if the electron beam 10 impinges on the tungsten needle 22.

Because the diameter of the electron beam 10 in the plane of the measuring structure 16 or the surface 20 is larger than the tungsten needle 22, different portions of the electron beam impinge on the tungsten needle as the electron beam 10 brushes across said tungsten needle 22, and a different intensity of the beam in these portions gives rise to a different number of back-scattered electrons.

In order to determine the beam profile systematically (or to guide the electron beam over the workpiece surface under working conditions) the optical system 15 is electronically controlled by a calculation, control and memory unit 30, and signals from the sensor ring are supplied to the calculation, control and memory unit 30 and determined as a function of the deflection control signals. In this process the focusing unit 12 and the deflector unit 14 are controllable separately.

This means that, in the measuring mode, the stream of back-scattered electrons 24 which reaches the sensor ring 26 is determined as a function of a value x (of the deflection in direction x; see the coordinates system in FIG. 1) and of a value y (of the deflection in direction y) of the electron beam 10 which is generated by the optical system 15, these data being outputtable as three-dimensional surfaces (not shown) or in the form of an image 32 which reproduces the electron density at a certain point z of the electron beam in a direction perpendicular to the beam direction S or to the principal beam direction A.

Figure 2:
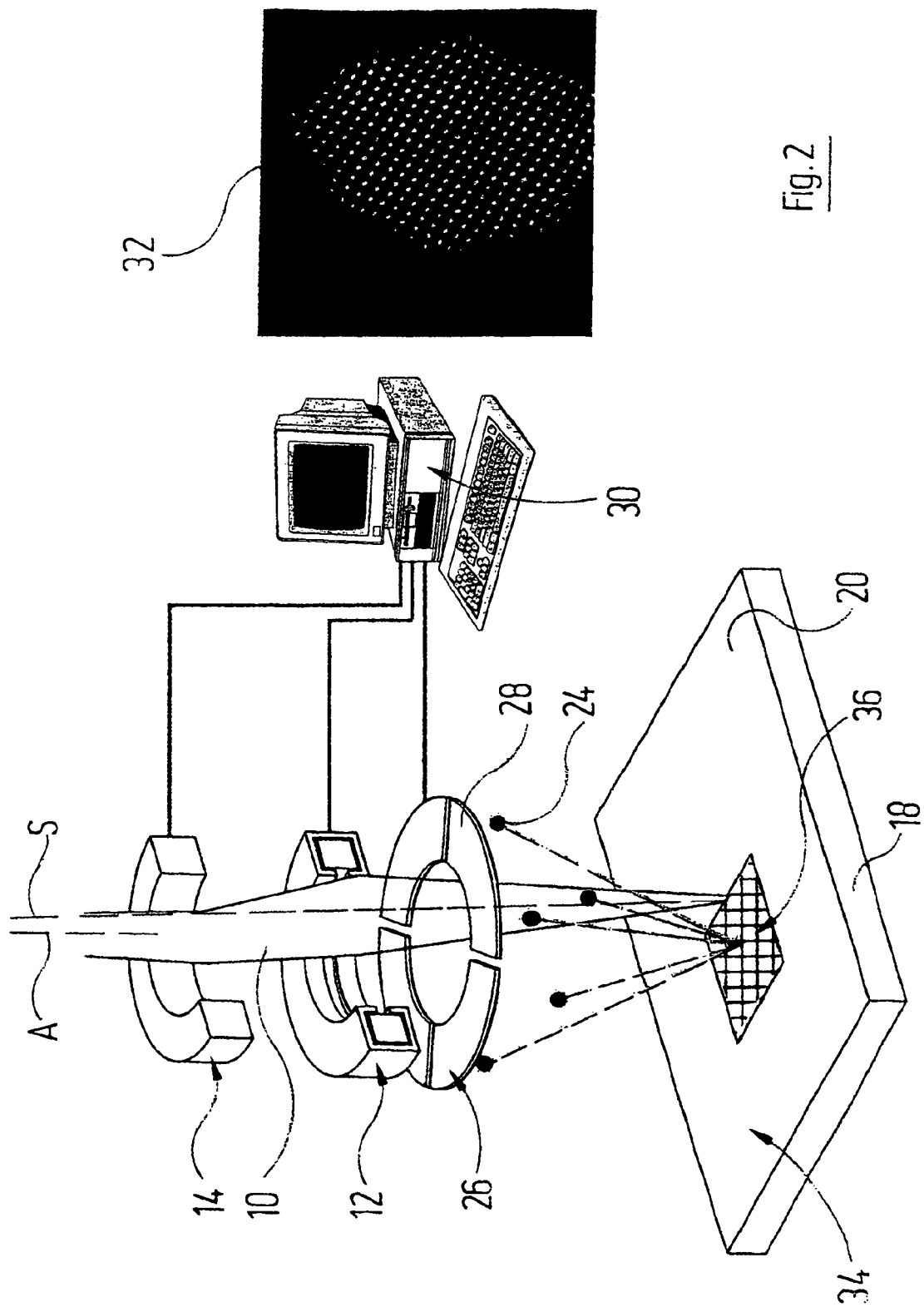
FIG. 2 shows schematically the structure for measuring the imaging properties of magneto-optical elements in an electron-beam welder.

With a different measuring structure, which is shown in FIG. 2 where it is designated as a whole by 34, the quality of the lens 12 and of the deflector unit 14 can be measured while using essentially the same structure, which measurement represents important information for evaluating the quality of the electron-beam welder.

Here, too, the measuring structure 34 includes a graphite slab 18 having a surface 20. Located in the central area of the graphite slab 18 on the surface 20, however, is a metal network 36, i.e. a network the network lines of which consist of metal. The network can rest directly on the graphite 18 so that here, too, back-scattered electrons 24 are emitted by the lines of the network, whereas the graphite background has no back-scattering effect.

A further difference from FIG. 1 is that, for better imaging of the network 36, the locations of the lens 12 and the deflector unit 14 are reversed.

Using a conventional imaging method based on scanning electron microscopy, an image 38 of the metal network 36 against the graphite background can be produced by means of the sensor ring 26. By computerised evaluation, familiar to a person skilled in the art, of the image 38, conclusions regarding the quality of the magneto-optical elements of the deflector unit 14 can be drawn on the basis of deviations of the individual lines from their rectilinear path, and from the distortions at the edge of the network reproduced.

In a modification, the measuring structure 34 can form part of the measuring structure 16 of FIG. 1, in which case the tungsten needle 22 mounted in a small graphite plate is inserted in the large graphite slab 18, and if it is then removed the metal network 36 in the graphite slab 18 is exposed.

The lens 12 must possibly then be refocused so that the network is sharply reproduced, whereas previously it was focused on the surface 20 from which the tungsten needle 22 stood out. Alternatively, the difference of distance can be compensated by a spacer plate made of graphite.

Alternatively again, a needle arrangement and a grid arrangement can be provided adjacently on a common graphite base slab and the two partial areas of the graphite slab can be placed alternately in the beam path, e.g. using a calibrated threaded spindle or a small working cylinder and stops defining the end positions on the slab.

The measuring structures 16 and 34, and the combined measuring structures discussed above, are so designed that they can be inserted easily and accurately into the electron-beam welder and can be easily removed (e.g. using alignment pins), so that the electron-beam welder can perform its proper function. For this purpose it is sufficient if the possibility of inserting and accurately positioning the graphite plate 18 exists in one imaging plane.

Because the measuring structures 16 and 34 are passive components, no additional lines must be installed in the measuring/working space of the electron-beam welder in order to determine the beam cross-section and the imaging properties of the optical system 15.

Figure 3:
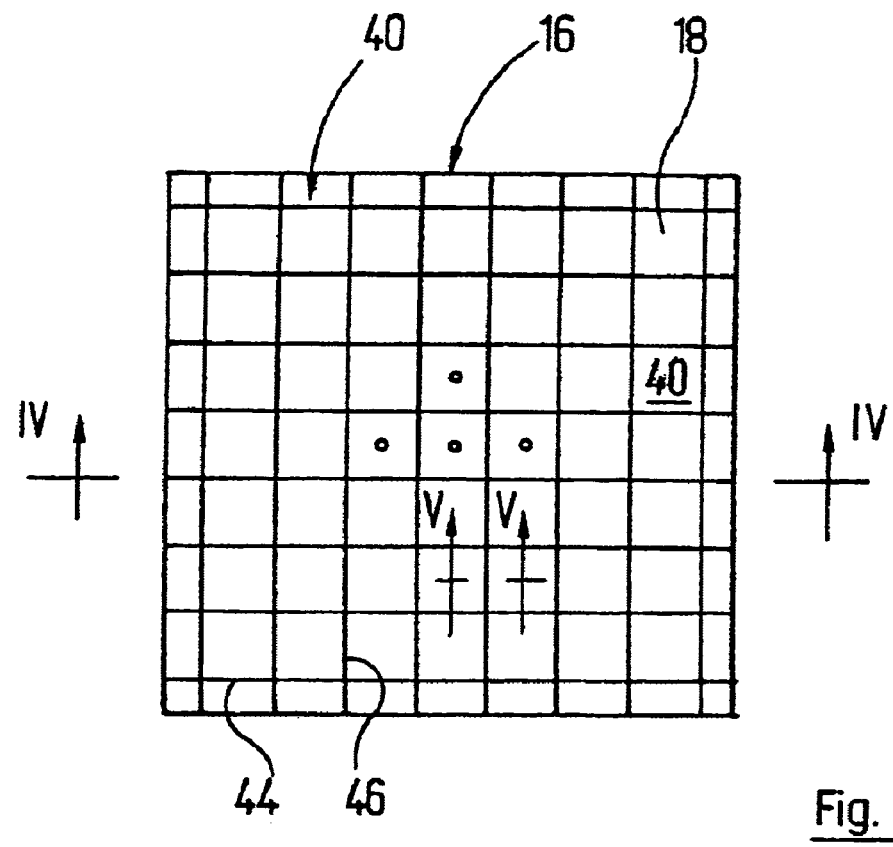
FIG. 3 is a plan view of a modified measuring structure having narrow back-scattering strips forming a grid.
Figure 4:
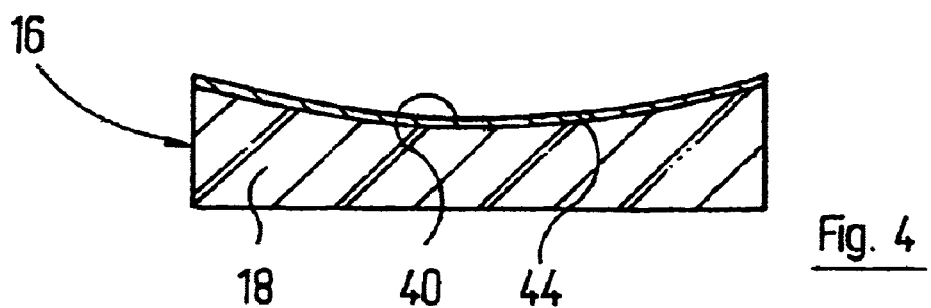
FIG. 4 shows a cross-section through the measuring structure according to FIG. 3 along the section line IV—IV in FIG. 3.

FIG. 3 shows in plan view a measuring structure 16 which again has a base 20 of graphite. The upper boundary face of the base 20 has a spherically concave configuration, the radius of the upper face 40 corresponding to the distance of the base 20 from the principal point H of the beam deflector unit 14 of the electron-beam welder. "Principal point" should be understood to mean the point at which, in an idealised representation, the electron beam deviates from its incidence direction (similarly to the case with optical lenses).

A network 42 consisting of sets of back-scattering strips 44, 46 arranged at right angles to one another is applied to the upper face 40. The back-scattering strips 44, 46 are again produced from a metal of high density, e.g. tungsten, and can be manufactured in any known manner, e.g. by cutting from a thin polished sheet with a laser beam or by bonding correspondingly narrow polished strips in the desired pattern to the upper face 40.

Figure 5:
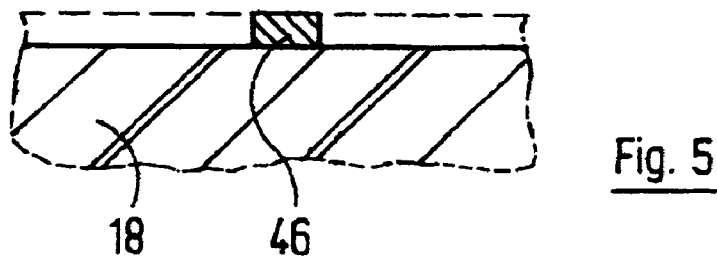
FIG. 5 shows an enlarged cross-section through a back-scattering strip of the measuring structure according to FIG. 3.

As can be seen from FIG. 5, the cross-section of the back-scattering strips 46 is rectangular, so that their free upper faces form in each case a back-scattering face 48.

To be able to measure in addition the intensity profile for different beam deflections using such a measuring structure, a preferably a very short tungsten needle 22 having an end face located substantially in the plane of the neighbouring back-scattering strips 44, 46 can be provided at the centre of selected grid cells or of all the grid cells. By passing the electron beam over the different tungsten needles 22 with scanning movements of small amplitude, the intensity profiles of the electron beam 10 for different angles of deflection can be measured, and by deflecting the electron beam across the grid lines the imaging properties of the optical system 15 formed by the focusing unit 12 and the deflector unit 14 can be measured.

Figure 6:
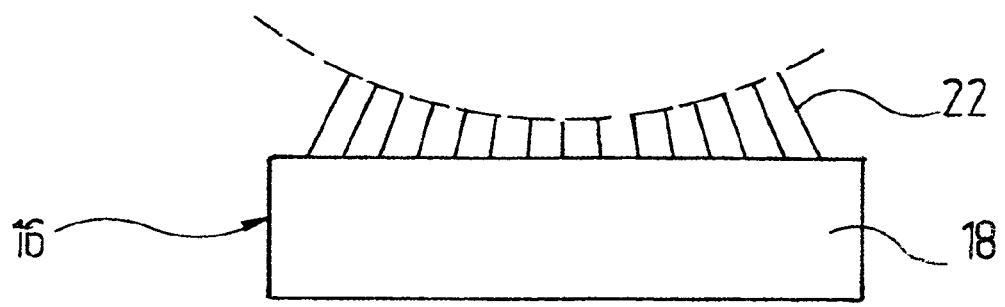
FIG. 6 shows a central cross-section through a modified measuring structure.

FIG. 6 shows a central section through a further modified measuring structure 16 in which the base 20 carries individual tungsten needles 22 which in each case are placed obliquely in such a way that their axes pass through the principal point H of the electron beam deflector unit. The measuring structure 16 according to FIG. 6 thus has a multiplicity of small back-scattering surfaces which in each case are perpendicular to the direction of a deflected electron beam and are at the same distance from the principal point H.

The tungsten needles 22 are arranged either in such a way that their foot portions form a square grid on the upper face of the base 20, or in such a way that a set of tungsten needles 22 is in each case arranged at the same distance from the axis of the electron gun and the tungsten needles 22 belonging to this set are arranged with equidistant angular spacing in the circumferential direction.

Figure 7:
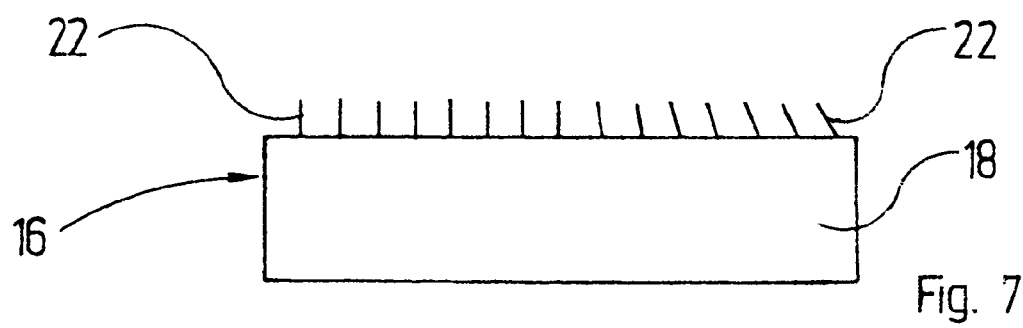
FIG. 7 shows a central cross-section through a further modified measuring structure.

The right-hand portion of the further modified measuring structure according to FIG. 7 resembles that of FIG. 6, except that the ends of the tungsten needles 22 all lie in the same plane and preferably are so arranged therein that the end faces form a square grid.

In the left-hand half of FIG. 7 all the tungsten needles stand perpendicularly on the surface of the base 20. Such an arrangement of the tungsten needles 22 can be of interest if it is not the intensity distribution of the electrons in the electron beam (perpendicular to the beam direction S) as such which is of interest, but only the distribution of the electrons, in so far as this is relevant to welding (or if the deflection radius is large in relation to the deflection distance). Because the workpiece surface generally is disposed perpendicularly to the principal beam direction A when welding, the many back-scattering end faces of the tungsten needles 22, as in the left-hand half of FIG. 7, reproduce the workpiece surface at a multiplicity of reference points.

Figure 8:
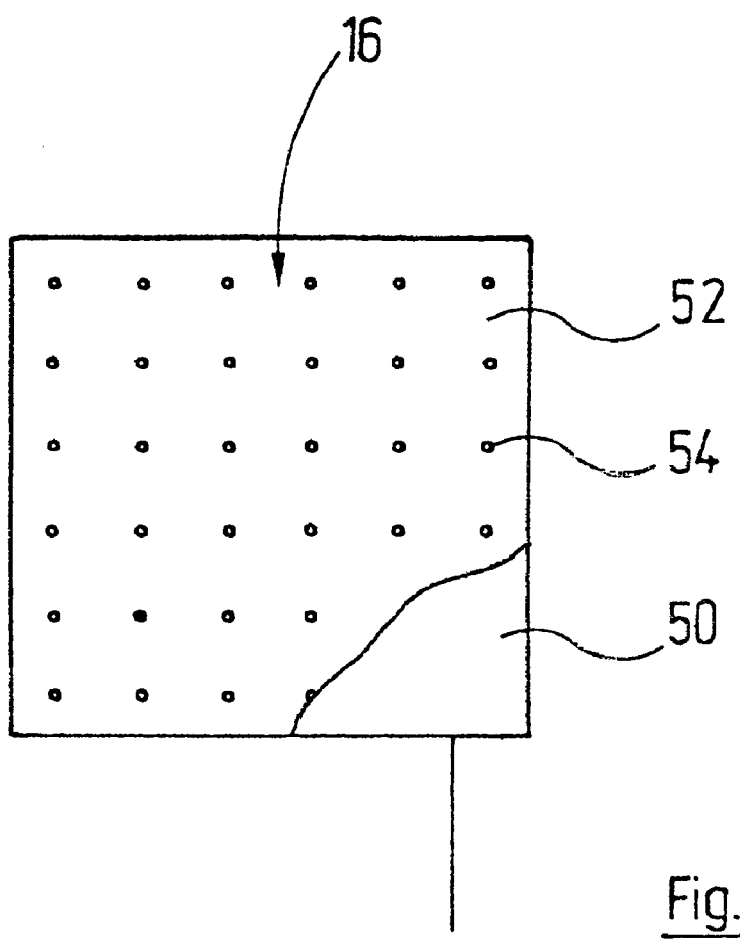
FIG. 8 is a plan view of a further modified measuring structure.

The embodiment according to FIG. 8 shows a measuring arrangement for measuring beam cross-section and imaging properties which includes a measuring structure 16 and an electrically conductive collector plate 50 located downstream of the latter. The measuring structure 16 consists of a plate 52 of tungsten in which holes 54 of small diameter are formed in a regular grid, e.g. by electron beam drilling.

This arrangement works in transmission and measures the stream of electrons captured by the collector plate 50 connected to an ammeter (not shown) as a function of the deflection (and optionally of the focusing) of the electron beam.

What is claimed is:

1. A method for measuring the intensity profile of an electron beam, in which the electron beam is directed by relative movement between the electron beam and a measuring structure on to different points of the latter which have different back-scattering properties, wherein a stream of electrons scattered in the reverse direction by the measuring structure is measured as a function of the relative movement of the electron beam and the measuring structure and wherein the measuring structure includes at least one opening, which allows the electron beam to pass through.

2. A method for measuring the intensity profile of an electron beam, in which the electron beam is directed by relative movement between the electron beam and a measuring structure on to different points of the latter which have different back-scattering properties, wherein a steam of electrons scattered in the reverse direction by the measuring structure is measured as a function of the relative movement of the electron beam and the measuring structure and wherein the measuring structure is formed by a needle, which includes at least one back-scattering surface which reflects the electron bean at least partially.

3. Method according to claim 2, wherein the needle is ground at its end.

4. Method according to claim 2, wherein the axis of the needle is disposed parallel to the mean direction of the electron beam.

5. Method according to claim 1, wherein the opening has in at least one direction a cross-sectional length which is shorter than the diameter of the electron beam.

6. Method according to claim 1, wherein the stream of back-scattered electrons is measured by means of a sensor ring extending around the axis of the electron beam.

7. Method according to claim 1, wherein the relative movement is generated by deflecting the electron beam by means of a magnetic field or an electrical field.

8. Method according to claim 1, wherein a measuring structure is used which includes a plurality of openings which are arranged at different distances from the incidence direction of the undeflected electron beam.

9. Method according to claim 8, wherein a measuring structure is used in which the openings are distributed uniformly in at least one of the radial and the circumferential directions.

10. Method according to claim 9, wherein a measuring structure is used in which the openings are so aligned that their axis pass through the principal point of the optical system.

11. Method according to claim 2, wherein the back-scattering surfaces are circular.

12. Method according to claim 1, wherein the relative movement between the electron beam and the measuring structure takes place in two independent directions which lie substantially in a plane disposed perpendicularly to the incidence direction of the undeflected electron beam.

13. Method according to claim 2, wherein a measuring structure is used which has adjacently to the back-scattering surfaces a flat surface of a material, which back-scatters only one of weakly or not at all.

14. Method according to claim 1 wherein the cross-section of the electron beam is measured at a plurality of openings which occupy different positions with respect to the incidence direction of the undeflected electron beam, and is compared to a cross-section of an electron beam as obtained by means of a correctly functioning optical system for an electron beam, and the imaging properties of the optical system are measured.

15. Method for measuring the intensity profile of an electron beam in which the electron beam is directed by relative movement between the electron beam and a measuring structure on to different points of the latter which have different back-scattering properties, wherein a stream of electrons scattered in the reverse direction by the measuring structure is measured as a function of the relative movement of the electron beam and the measuring structure and wherein the measuring structure is in the form of a grid, wherein at least a considerable portion of the grid is impinged upon by the electron beam through the relative movement between the electron beam and the measuring structure, wherein the stream of back-scattered electrons as a function of the relative movement is converted into an image of the measuring structure and this image is compared to a reference image of the measuring structure as obtained by means of a correctly functioning optical system for an electron beam.

16. A method for compensating deflection errors of an optical system for an electron beam, wherein imaging properties of the optical system for the electron beam are determined using the method according to claim 15 and at least one controllable component of the optical system is so adjusted that the difference between the actual image and the reference image of the measuring structure is minimised.

17. A measuring structure, for use in a method according to claim 1, characterised in that it has a base which includes at least one opening.

18. Measuring structure according to claim 17, characterised in that the axis of the openings pass through a principal point of the optical system.

19. Measuring structure for use in a method according to claim 2, which has a base which carries at least one back-scattering surface, wherein the back-scattering surfaces are formed by end faces of the needles.

20. Measuring structure according to claim 19, wherein the needle is ground smooth at its free end.

21. Measuring structure according to claim 17, characterised wherein the flat surface of the base is formed by a material, in particular graphite, which back-scatters one of weakly or not at all.

22. Measuring structure according to claim 17, which includes back-scattering strips forming a grid and additionally includes at least one back-scattering surface in each of the areas delimited by the edges of the grid meshes.

23. Measuring structure according to claim 22, wherein the back-scattering surfaces are located in each case at the centres of the areas delimited by the edges of the grid.

24. Measuring structure according to claim 17, characterised by a collector plate located downstream of said measuring structure, viewed in the direction of the beam.

25. An electron-beam machining device, comprising: a measuring structure according to claim 17, and a back-scattered electrons measuring device arranged in the electron beam path upstream of the measuring structure.

26. Electron-beam machining device according to claim 25, wherein the back-scattered electrons measuring device includes a sensor ring.

27. Electron-beam machining device according to claim 25, including an optical system which is electronically controlled by means of control signals of a control unit, a memory unit at the same time detecting signals from the back-scattered electrons measuring device as a function of the control signals.

28. Electron-beam machining device according to claim 27, wherein the optical system, together with the control unit and the back-scattered electrons measuring device, are designed to generate an image produced by scanning electron microscopy.

29. Electron-beam machining device according to claim 19, wherein in the case of a measuring structure which has an essentially punctual back-scattering surface, a focusing lens of an optical system for an electron beam is located upstream of a beam deflector unit, viewed in the direction of the beam.

30. Electron-beam machining device according to claim 19, wherein in the case of a measuring structure which has an extensive back-scattering surface, a focusing lens of an optical system for an electron beam is located downstream of a beam deflector unit, viewed in the direction of the beam.

31. Method in accordance with claim 2, wherein the needle is a metal needle.

32. Method in accordance with claim 31, wherein the metal needle is of a heavy metal such as tungsten.

33. Method in accordance with claim 2, wherein the back-scattering surface is disposed perpendicularly to the mean direction of the electron beam.

34. Method in accordance with claim 2 wherein the back-scattering surface has in at least one direction a cross-sectional length which is shorter than the diameter of the electron beam.

35. Method in accordance with claim 2 wherein the relative movement is generated by deflecting the electron beam by means of a magnetic field or an electrical field.

36. Method in accordance with claim 2 wherein a measuring structure is used which includes a plurality of back-scattering surfaces which are arranged at different distances from the incidence direction of the undeflected electron beam.

37. Method in accordance with claim 2 wherein a measuring structure is used in which the back-scattering surfaces are distributed uniformly in at least one of the radial and the circumferential directions.

38. Method in accordance with claim 2, wherein a measuring structure is used in which the back-scattering surfaces are so aligned that their normals pass through the principal point of the optical system.

39. Method in accordance with claim 2 wherein the relative movement between the electron beam and the measuring structure takes place in two independent directions which lie substantially in a plane disposed perpendicularly to the incidence direction of the undeflected electron beam.

40. Method in accordance with claim 13, wherein the material of the flat surface is graphite.

41. Method in accordance with claim 2 wherein the measuring structure has adjacently to the back-scattering surfaces a flat surface of a material, which back-scatters one of only weakly or not at all.

42. Method in accordance with claim 41, wherein the material of the flat surface is graphite.

43. Method in accordance with claim 2 wherein the cross-section of the electron beam is measured at a plurality back-scattering surfaces which occupy different positions with respect to the incidence direction of the undeflected electron beam, and is compared to a cross-section of an electron beam as obtained by means of a correctly functioning optical system for an electron beam, and the imaging properties of the optical system are measured.

44. Method for compensating deflection errors of an optical system for an electron beam, wherein the imaging properties of the optical system for the electron beam are determined using the method according to claim 43 and at least one controllable component of the optical system is so adjusted that the difference between the actual image and the reference image of the measuring structure is minimised.

45. Method for compensating deflection errors of an optical system for an electron beam, wherein the imaging properties of the optical system for the electron beam are determined using the method according to claim 15 and at least one controllable component of the optical system is so adjusted that the difference between the actual image and the reference image of the measuring structure is minimised.

46. Measuring structure in accordance with claim 19, wherein the needles are made from a heavy metal such as tungsten.

47. Measuring structure in accordance with claim 20 wherein end faces of the needles are substantially parallel to the flat surface of the base.

48. Measuring structure in accordance with claim 21, wherein the flat surface of the base is formed by graphite.

49. Measuring structure in accordance with claim 20, wherein the flat surface of the base is formed by graphite.

50. Measuring structure in accordance with claim 19, which includes back-scattering strips forming a grid and additionally includes at least one back-scattering surface in each of the areas delimited by the edges of the grid meshes.

51. Measuring structure in accordance with claim 50, wherein the back-scattering surfaces are located in each case at the centres of the areas delimited by the edges of the grid meshes.

52. An electron-beam machining device, comprising: a measuring structure according to claim 19, and a back-scattered electrons measuring device arranged in the electron beam path upstream of the measuring structure.

53. Electron-beam machining device according to claim 52, wherein the back-scattered electrons measuring device includes a sensor ring.

54. Electron-beam machining device according to claim 52, including an optical system which is electronically controlled by means of control signals of a control unit, a memory unit at the same time detecting signals from the back-scattered electrons measuring device as a function of the control signals.

55. Electron-beam machining device according to claim 54, wherein the optical system, together with the control unit and the back-scattered electrons measuring device, are designed to generate an image produced by scanning electron microscopy.

56. Method in accordance with claim 1, wherein measuring of the profile of an electron beam is part of one of a method of measuring an optical system for an electron beam and a method of adjusting an optical system for an electron beam.

57. Method in accordance with claim 2, wherein measuring of the profile of an electron beam is part of one of a method of measuring an optical system for an electron beam and a method of adjusting an optical system for an electron beam.

58. Method in accordance with claim 15, wherein measuring of the profile of an electron beam is part of one of a method of measuring an optical system for an electron beam and a method of adjusting an optical system for an electron beam.

59. The method of claim 1 wherein the electron beam is a beam of an electron-beam machining device.

60. The method of claim 2 wherein the electron beam is a beam of an electron-beam machining device.

61. The method of claim 15 wherein the electron beam is a beam of an electron-beam machining device.

62. Method in accordance with claim 1, wherein the opening is one of a slit or a circular hole.

* * * * *

UNITED STATES PATENT AND TRADEMARK OFFICE
CERTIFICATE OF CORRECTION

PATENT NO. : 6,977,382 B2
DATED : December 20, 2005
INVENTOR(S) : Thorsten Lower It is certified that error appears in the above-identified patent and that said Letters Patent is hereby corrected as shown below:

Title page,
Item [30], Foreign Application Priority Data, application number should read -- 102 32 230.9 --.

Column 11,
Line 3, after "material," delete "in particular graphite,".

Signed and Sealed this

Twenty-first Day of March, 2006

JON W. DUDAS
*Director of the United States Patent and Trademark Office*